United States Patent [19]  [11] 4,090,928
Pantiga et al.  [45] May 23, 1978

[54] METHOD FOR SELECTIVELY PLATING LEAD FRAMES

[75] Inventors: Gene N. Pantiga, San Jose; Robert M. Allen, Mill Valley, both of Calif.

[73] Assignee: National Semiconductor Corporation, Santa Clara, Calif.

[21] Appl. No.: 777,234

[22] Filed: Mar. 11, 1977

Related U.S. Application Data

[62] Division of Ser. No. 628,541, Nov. 3, 1975, Pat. No. 4,033,844.

[51] Int. Cl.² .......................... C25D 5/02; C25D 5/10
[52] U.S. Cl. ........................................ 204/15; 204/40
[58] Field of Search .................................. 204/15, 40

[56] References Cited
U.S. PATENT DOCUMENTS

| | | |
|---|---|---|
| 3,723,283 | 3/1973 | Johnson et al. ................ 204/224 R |
| 3,745,105 | 7/1973 | Kosowsky et al. ............. 204/224 R |
| 3,746,630 | 7/1973 | Kosowsky et al. ............. 204/224 R |

Primary Examiner—T. M. Tufariello

Attorney, Agent, or Firm—Gail W. Woodward

[57] ABSTRACT

A novel plated lead frame strip and a novel method and apparatus for selectively plating the strip is described. The strip comprises a plurality of identical lead frame sections. Each of the lead frame sections comprises a plurality of leads. Each lead has a lead tip. In the center of each section and surrounded by the lead tips is a die-attach pad. The apparatus comprises in combination three plating stations. Each of the three stations is provided for plating a predetermined part of each of the lead frame sections. In the first station, a means is provided for plating the tips and the pad of a lead frame section with a first predetermined metallic plating — e.g., a gold or copper strike. In the second station, a means is provided for masking the tips and plating the pad only with a second predetermined metallic plating — e.g., a gold finish. In the third station, a means is provided for masking the pad and plating the tips with a third predetermined metallic plating — e.g., silver. The stations are arranged in such a fashion that all three may be plating simultaneously with each one plating its respective part in the desired plating sequence.

1 Claim, 24 Drawing Figures

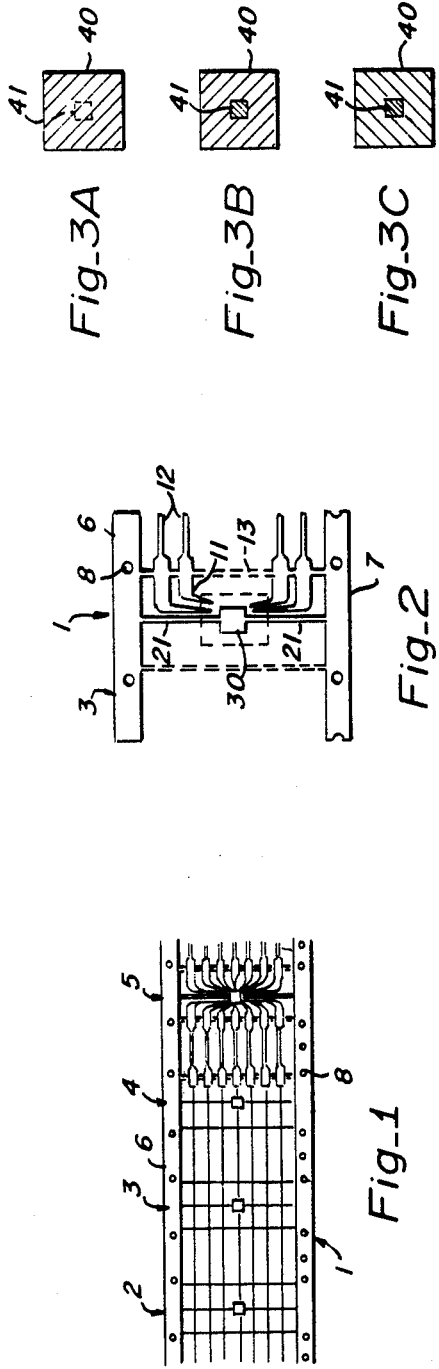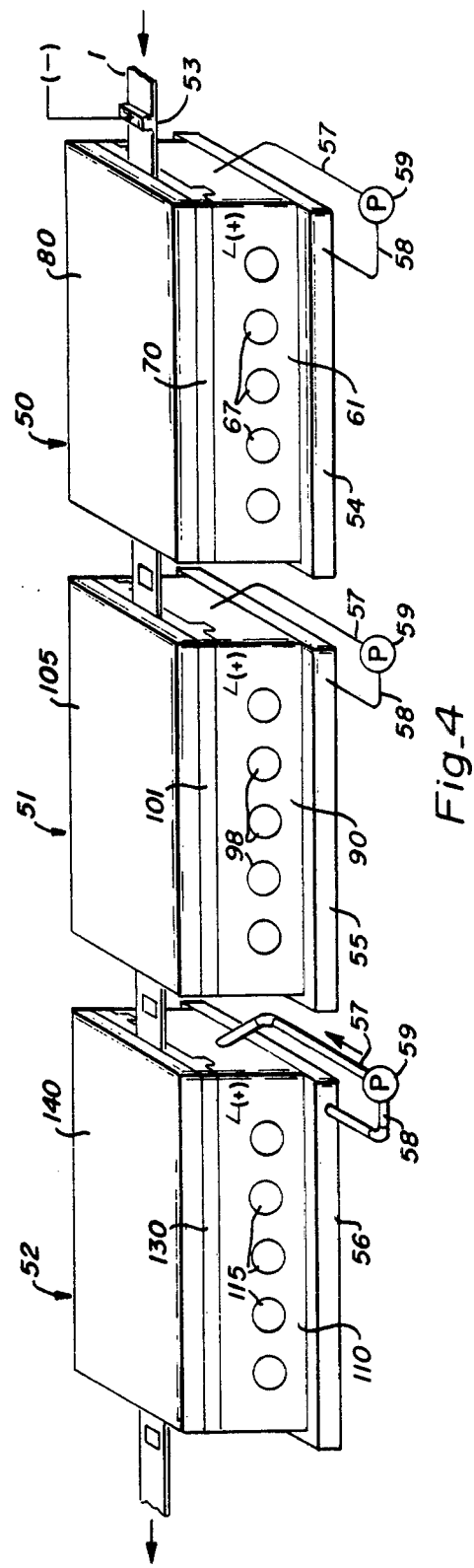

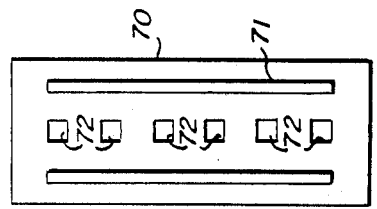
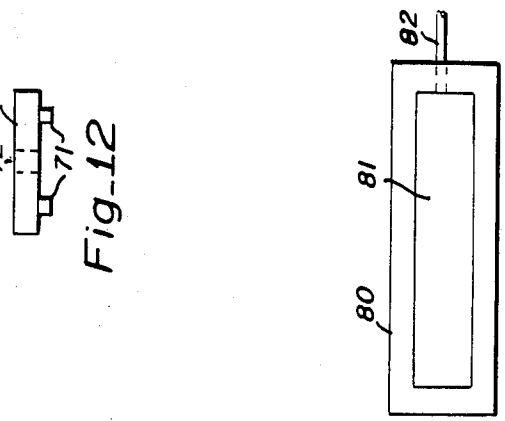
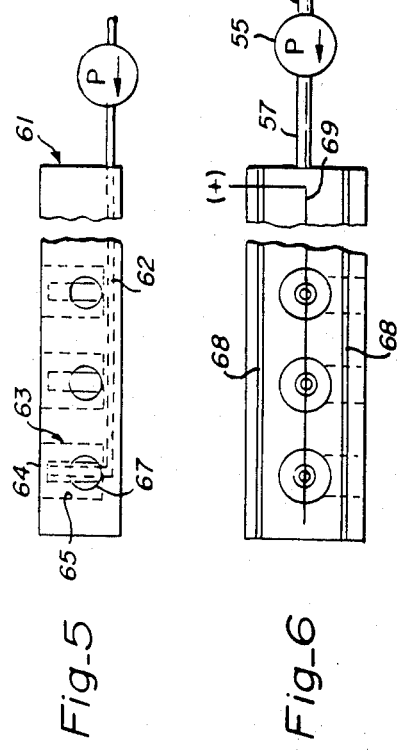
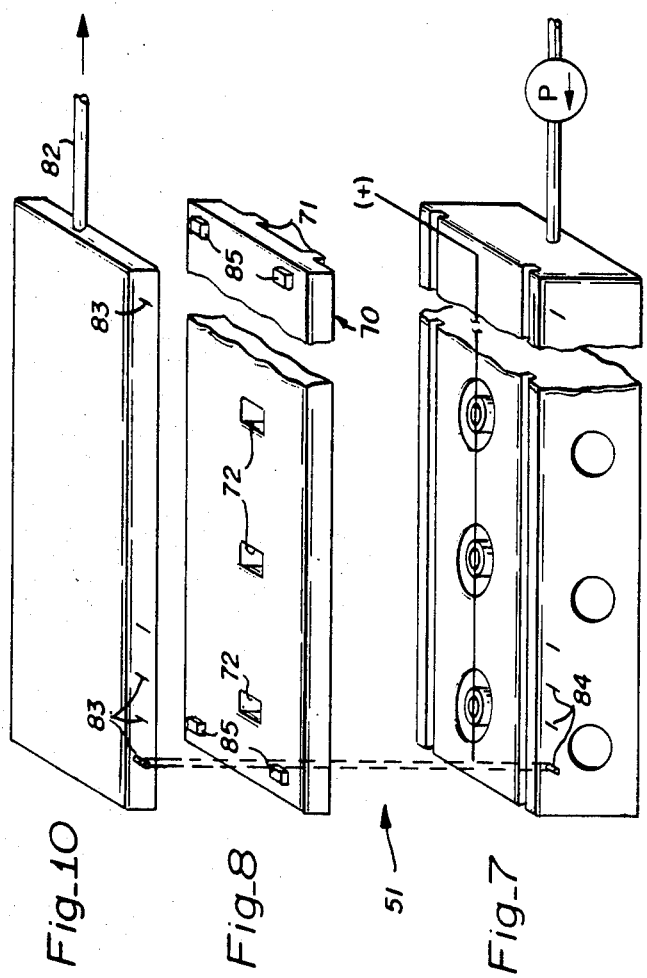

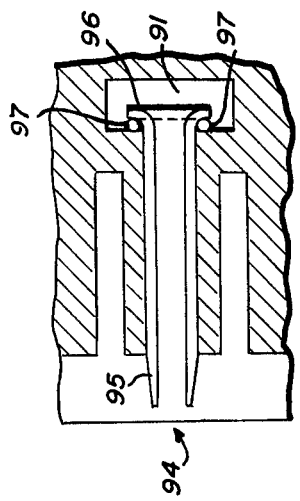
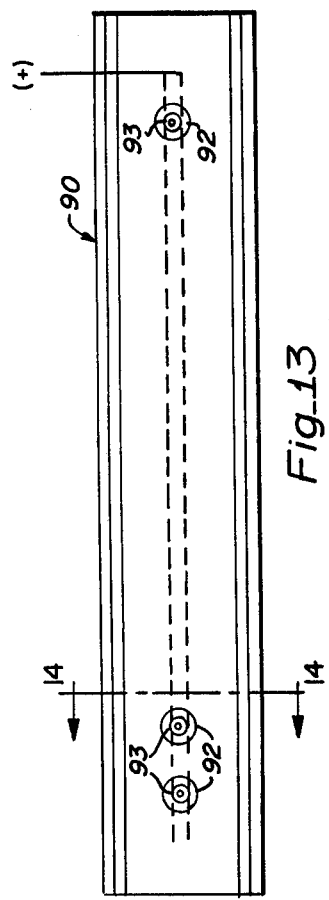
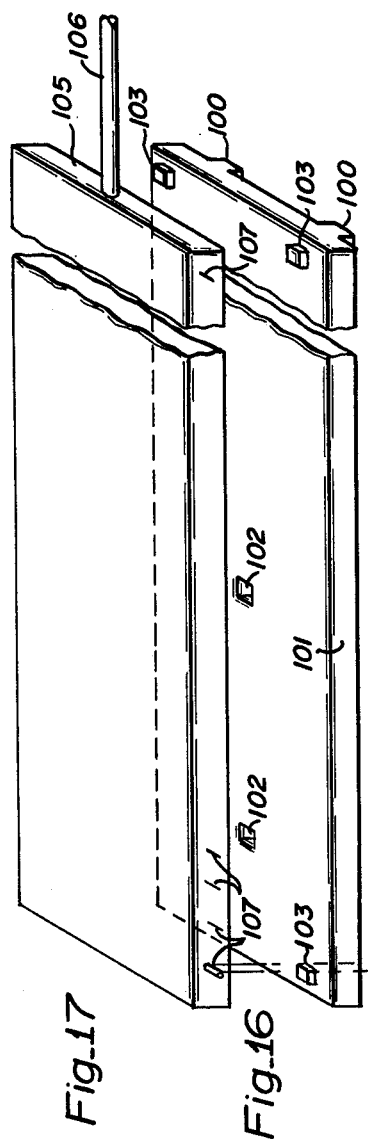
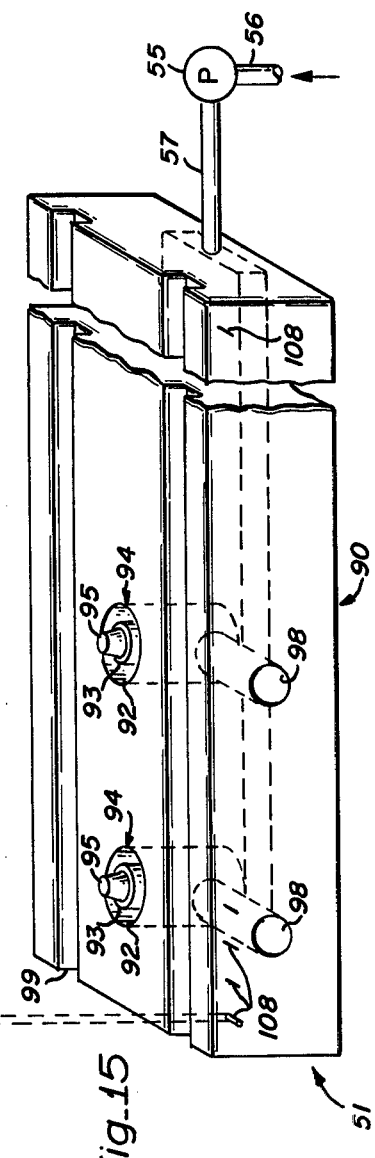

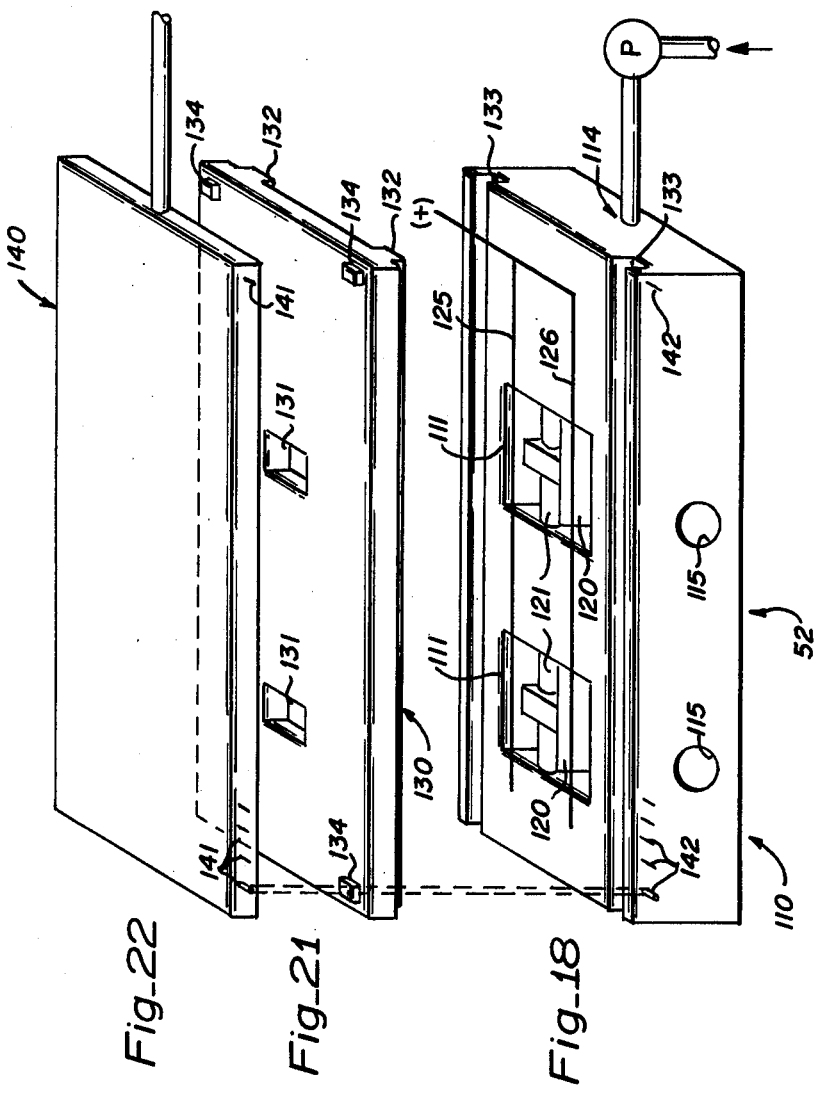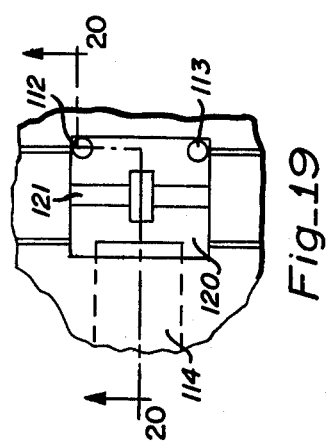

METHOD FOR SELECTIVELY PLATING LEAD FRAMES

This is a division of application Ser. No. 628,541, filed Nov. 3, 1975, now U.S. Pat. No. 4,033,844.

BACKGROUND OF THE INVENTION

The present invention is directed to a method and apparatus for plating lead frames used in fabricating integrated circuit devices and the like. In the fabrication of solid state devices, the lead frames are oftentimes heated when bonding a chip to the die-attach pad to form a gold-silicon eutechtic. When a lead frame is heated, the heat, depending on the metal used, oxidizes the metal. To avoid the effects of oxidation of the metal, and, in particular, to avoid the creation of an electrically insulating oxide on the metal surfaces, in the area of electrical contacts, it has been the practice to plate the electrical contact areas of the lead frames with gold or silver or like metal.

Initially, to have good electrical contact surfaces and form a gold-silicon eutectic, an entire lead frame or at least the entire surface of one side of the lead frame, in particular the side on which the semiconductor chip is bonded, was plated with gold. There was no selective masking of any parts of the frame. This type of plating used a great amount of gold.

Later, to conserve gold and thus reduce costs, as the cost of gold increased, the entire surface of the frame on the side on which the chip is attached was plated with silver and the use of gold was restricted in that it was selectively bonded on the die-attach pad alone in a two-step process.

In a still further development, the practice was to selectively restrict the plating of gold to the die-attach pad and to the lead tips so as to also conserve silver and gold.

In summary, in accordance with the prior described practices, lead frames have been provided with a gold-plated die-attach pad for forming the required gold-silicone eutectic and a silver or gold plated lead tip area for oxidation. created during fabrication for providing good electrical contacts.

With the still ever increasing cost of gold, however, the amount of gold used in plating each lead frame becomes an appreciable percentage of its cost and is, if unnecessary, a needless waste of an important natural resource.

It would seem a simple matter to plate the lead tips and die-attach area with silver and, thereafter, to plate the die-attach area with gold in a two-step process. However, it is found that when gold is plated over silver, the gold combines with the silver to the extent that as much as 66% more gold is required for forming a suitable gold-silicon eutectic than is required in the absence of silver as substrate plating.

SUMMARY OF THE INVENTION

In view of the foregoing, the principal objects of the present invention are a selectively plated lead frame, and an apparatus for and method of plating the same.

In accordance with the above objects, there is provided a novel plating apparatus comprising three plating stations arranged in a series fashion. In the first station, a means is provided for plating a gold strike or copper on the area of a lead frame consisting of the die-attach pad and tips of the leads. In the second station, a means is provided for plating a gold finish on the die-attach pad. In the third station, a mean is provided for masking the die-attach pad plated in the second station and for plating silver on the tips of the leads surrounding the masked die-attach pad.

The stations are arranged in a series fashion so that a continuous strip or series of lead frames may be sequenced in a step-like fashion through the stations such that the plating performed in each station is carried out simultaneously.

In general, the means provided in each station for plating the lead frames comprises a plurality of fluid jets, means associated with each of the jets for masking the lead frames so as to restrict the flow of plating fluid to selected areas of the lead frames and means for causing a current to flow between the plating fluid and the lead frame so as to remove the metal from the fluid and deposit it on the frames.

By plating the lead frames with the apparatus described in the manner described, the plating is performed quickly and efficiently and, because gold is not plated over silver on the die-attach pad, there is a significant saving in money and a valuable natural resource.

DESCRIPTION OF THE DRAWINGS

The above and other objects, features and advantages of the present invention will become apparent from a reading of the following detailed description and the accompanying drawings in which:

FIG. 1 is a view of a portion of a typical lead frame strip which can be plated in the apparatus and according to the method of the present invention.

FIG 2 is an enlarged view of one of the lead frames of FIG. 1.

FIGS. 3A, 3B and 3C are diagrammatic representations of the lead tip and die-attach pad areas of the lead frame of FIG. 2.

FIG. 4 is a perspective representation of three plating stations according to the present invention.

FIG. 5 is an elevation view of a first one of the plating heads of the present invention.

FIG. 6 is a plan view of the head of FIG. 5.

FIG. 7 is a perspective view of the head of FIGS. 5 and 6.

FIG. 8 is a perspective view of a first masking member according to the present invention.

FIG. 9 is a bottom plan view of the member of FIG. 8.

FIG. 10 is a perspective view of a back-up member according to the present invention.

FIG. 11 is a bottom plan view of the member of FIG. 10.

FIG. 12 is an end view of the member of FIG. 9.

FIG. 13 is a plan view of a second plating head member according to the present invention.

FIG. 14 is a cross-sectional view taken along lines 14—14 in FIG. 13.

FIG. 15 is a perspective view of the head member of FIG. 13.

FIG. 16 is a perspective view of a second masking member according to the present invention.

FIG. 17 is a second perspective view of the back-up member of FIGS. 10 and 11.

FIG. 18 is a perspective view of a third plating head member according to the present invention.

FIG. 19 is a plan view of one of the fluid jetting means of the head of FIG. 18.

FIG. 20 is a cross-sectional view taken along lines 20—20 in FIG. 19.

FIG. 21 is a perspective view of a third masking member according to the present invention; and FIG. 22 is a third perspective view of the back-up member of FIGS. 10 and 11.

DETAILED DESCRIPTION

Referring to FIGS. 1 and 2, there is shown a section of a representative lead frame strip 1 comprising a plurality of lead frame sections 2, 3, 4 and 5. All of the sections 2, 3, 4 and 5, each one of which is shown between a pair of parallel dashed lines, are identical and are fabricated and processed together with other sections in coils typically comprising thousands of such sections. The sections, or lead frames as they are sometimes referred to herein, are supported together for this purpose by a pair of relatively wide margins 6 and 7. In margins 6 and 7 there is provided a plurality of sprocket holes 8. Holes 8 are used for advancing the strip 1 through various stages of fabrication and processing, including the step-like plating processing described herein.

As seen more clearly in FIG. 2, in which there is shown an enlarged view of section 3 of the strip 1 of FIG. 1, there is provided in each of the sections 2-5, a plurality of elongated, generally L-shaped leads 10. Each of the leads 10 is terminated at its interior end by a relatively narrow tip portion 11. Extending from the tip portion 11 is an exterior portion 12. The end of portion 12 is joined to an adjacent section — e.g., section 2 or 4 — by a portion of the lead having a reduced cross-section. Between adjacent leads 10 and between the leads 10 and margins 6 and 7, there are also provided supporting strips or wires 13. The wires 13 are employed to support the leads until they are embodied in a finished device, at which time they are cut away to separate the leads. In the center of each of the sections 2-5 there is provided a die-attach pad 20. Pad 20 is supported between the margins 6 and 7 by a pair of wire supporting members 21. In subsequent processing of the strip 1, when individual integrated circuit devices are being made, the supporting members 21 and margins 6 and 7, like wires 13, are also cut away and the sections 2-5 are separated. Those processing steps, however, form no part of the present invention and, therefore, are not further described.

As shown in FIG. 2, there is identified an area enclosed by a rectangular dashed line 30. Line 30 identifies the area, including the pad 20 and the tip portion of the ends of the leads 10. Dashed line 30 represents the exterior boundary of the areas plated in accordance with the present invention.

Referring to FIGS. 3A, 3B and 3C, there are shown three rectangular areas 40. Each of the areas 40 corresponds to the area of the lead frame section 3 bounded by the dashed line 30 in FIG. 2. In the interior of each of the areas 40 there is shown a smaller rectangular area 41. Each of the areas 41 corresponds to the area of the die-attach pad 20 in FIG. 2.

As will become apparent, plating according to the present invention is in a sequence of three steps. In the first step, as represented in FIG. 3A, the areas of the lead frame section corresponding to the areas 40 and 41 are plated with a gold or copper strike, as shown by the diagonal lines extending across both of the areas. In the second step, as represented in FIG. 3B, the area 40 outside of the area 41 is masked and the area 41 is plated with a gold finish. In the third step, as represented in FIG. 3C, the area 41 is masked and the area 40 outside of the area 41 is plated with silver.

While the selective plating of the areas 40 and 41 with gold and silver as described is important in the present invention, it is to be understood and is contemplated that in certain applications, metals other than gold and silver may be employed and that, once understood, the sequence of the steps herein described can readily be interchanged in specific applications. In this regard, however, it is important to recall that the sequence as outlined herein for plating gold on the die-attach pad and silver on the lead tips should be followed if the use of excessive gold, caused by the large amount of gold which combines with silver as previously described, is to be avoided.

Referring to FIG. 4, there is provided three plating stations 50, 51 and 52. The exterior appearance of each of the stations 50, 51 and 52 is quite similar. The interior components of each, however, are specially constructed for performing, respectively, the first, second and third plating steps described above. Before describing each of the stations in particular, however, it may be helpful to describe a few of the common features.

As shown in FIG. 4, the strip 1 is fed typically from a coil into one end of the station 50. After passing through station 50 in the direction of the arrow to the right of station 50, it enters station 51. After passing through station 51, the strip 1 passes through station 52. Thereafter the strip may be coiled or further processed. The movement of the strip 1 through the stations 50, 51 and 52 is provided by a step or sequencing dirve motor assembly of conventional construction (not shown) which is adapted for transporting the strip 1 very accurately by means of a sprocket which engages the sprocket holes 8. Other means, of course, may be used. The amount or distance strip 1 is transported during each sequencing step depends on the length of the individual stations 50-52. More precisely, if the stations 50-52 plate simultaneously, ten sections of the strip 1 during each sequence, then the transporting motor assembly will transport strip 1 a distance corresponding to the length of ten frame sections during each sequence or step.

Immediately to the right of station 50 and in sliding contact with strip 1 is a sliding contact 53. Contact 53 is coupled in any suitable manner to the negative pole of a d.c. potential source. Since strip 1 is continuous throughout the stations 50-52, contact 53 serves as the cathode electrode for each of the stations. While only a single cathode electrode is illustrated, it is intended that a plurality of such electrodes may be employed to reduce or in other respects modify and control current distribution in the strip 1.

The plating fluid employed in each of the stations 50-52 is recirculated through the stations. To capture the spent fluid, there is provided for the stations 50-52, a plurality of fluid containers 54, 55 and 56, respectively. Coupled to each of the containers 54-56 is a fluid pump 59. Pump 59 is provided for pumping fluid from the containers 54-56 through a pair of pipes 57 and 58 back through the stations. In a typical embodiment, this is most easily achieved by supporting each of the stations inside its respective container as shown. Having been described generally, the stations 50-52, beginning with station 50, will now each be described in detail.

Referring to FIGS. 5-12, there is provided in station 50, a head member 61. The head member 61, as are all of the non-electrical parts of the stations which come in contact with the plating fluid, is made of a plastic or other non-metallic material which is compatible with the plating fluid. In the base of head member 61, there is provided a fluid manifold 62. Manifold 62 may consist of an enlarged fluid passageway which may be provided in the member 61 as by drilling. Extending from the manifold 62 is a plurality of fluid jets 63. Each of the jets 63 comprises a tubular member 64 which extends upwardly in the center of a chamber 65 and is provided with a fluid passageway 66. Passageway 66 extends through the center of the member 64 and is provided to be in fluid communication with the manifold 62. Extending from each of the chambers 65 is a fluid discharge port or outlet 67. In the top surface of the head member 61 is a pair of mask-aligning channels 68. Also in the top surface of the head member 61 and in a slot of its own, is a wire or the like 69. Wire 69 is provided to extend over the open end of the passageway 66 in each of the jets 63 and is adapted for coupling to the positive pole of the d.c. source which is coupled to the cathode electrode 53.

Referring to FIGS. 8 and 9, there is provided a masking member 70. In the under-surface of masking member 70 there is provided a pair of parallel ribs 71. Ribs 71 are adapted to fit in the slots 68 in the top of member 61 to facilitate aligning the member 70 longitudinally on the member 61 and prevent its lateral displacement with respect thereto. The longitudinal displacement of the member 70 is restricted by a back-up member 80 described below. Intermediate the ribs 71 is a plurality of rectangular apertures 72. The size of each of the apertures 72 corresponds to the areas 40 described above with respect to FIGS. 3A, 3B and 3C and the area bounded by the dash lines 30 in FIG. 2. The position of the apertures 72 in the masking member 70 is such that each one of the apertures is provided to be in registration with one of the passageways 66 in one of the jets 63 in member 61 when the member 70 is inserted and aligned longitudinally in the slots 68. At opposite ends of the masking member 70, there is also provided a plurality of guiding members 85. Members 85 are provided for engaging the sides of the strip 1 and aligning it laterally with respect to the apertures 72 such that the areas 40 on the strip are precisely over the apertures at the time of plating. The material of which the member 70 is made is such as to form a fluid-tight seal with the strip 1 at the edges of the area 40.

Referring to FIGS. 9 and 10, there is shown the back-up plate or member 80. In the underside of member 80 there is provided a recessed portion in which is mounted an inflatable bladder 81. Coupled to bladder 81 is an air hose fitting 82. Fitting 82 is provided for coupling the bladder 81 to a source of air under pressure. Along each side of the member 80 and extending outwardly therefrom there is provided a plurality of relatively short pin-like members or the like 83. Similarly, along each side of the head member 61 and extending outwardly therefrom there is provided a corresponding number of relatively short pin-like members or the like 84. Pin members 83 and 84 are provided for receiving elastic members, such as rubber bands or the like (not shown) for securing the back-up members 80 and the masking member 70 securely to the top of the head member 61.

In use, the masking member 70 is positioned between the back-up member 80 and the head member 61. With the bladder 81 initially deflated, the strip 1 is inserted between the members 70 and 80 and aligned by means of the guide members 85 over the apertures 72. When the strip 1 is thus positioned, the bladder 81 is inflated for sealing the backside of the strip and each of the areas 40 in each of the lead frame sections described with respect to FIG. 3A, is exposed to a flow of plating fluid from one of the jet fluid passageways 66. The wire 69 is then coupled, as by a switch (not shown), to the positive pole of the d.c. source coupled to the cathode electrode 53. When the wire 69 is connected to the d.c. source, a current will flow in the fluid between the jet 63 and the strip 1. This will cause a metal, such as gold, in the fluid, to plate out and adhere to the exposed surface of the strip — in this case, the area 40. After a predetermined period of time, the current flow is terminated and the bladder 81 is deflated. At all times during the flow of fluid from the jet 63, spent fluid from the strip 1 will fall into the chamber 63 and be discharged freely through the discharge outlet 67 and into the container 54 for recirculation by the pump 55 through the station.

It may be noted, at this point, that the recirculation through the stations 50–52 need not be interrupted during sequencing of the strip 1 from one station to another. This is because plating will occur only when there is a completed electrical path between the d.c. potential source, the fluid and the strip. Thus, after deflation of the bladder 81, the section of strip 1 plated in station 50 is free to be moved longitudinally to the next station, station 51, without interrupting the flow of fluid in the station. This reduces the need for certain valves, simplifies controls and results in significant economies.

Referring to FIGS. 13–17, there is provided in station 51, a head member 90 for coupling to the pump 59. In member 90 and extending substantially for the length thereof, there is provided a fluid manifold 91. Extending upwardly from manifold 91 and centrally located in a chamber 92, is a plurality of tubular members 93. Each of the tubular members 93 is provided with a central passageway in which is fitted a metallic tubular member 94. Member 94 is provided with a tapered end portion 95 and a flared or rolled lower end portion 96. End 95 is provided for forming a nozzle or nozzle outlet. Rolled end 96 is formed in the vicinity of the manifold 91 for making electrical contact with a pair of wires 97. Wires 97 are provided for coupling to the positive pole of a d.c. source having its negative pole coupled to the contact 53. It may be noted at this point that, by using the metallic nozzle 94 connected to the wires 97, there is avoided the placement of an interfering member in the fluid flow from the nozzle. Extending from the lower end of each of the chambers 92 and through the side of member 90, is a discharge port or outlet 98. Outlet 98 is provided for freely discharging spent fluid into the container 55. In the top surface of member 90 is a pair of longitudinal slots 99 for aligning a masking member 101.

Slots 99 are provided for receiving a corresponding pair of ribs 100 in the masking member 101. As with the ribs 71 in FIG. 8, ribs 100 are provided on the underside of the masking member 101 for aligning the masking member laterally on the head member 90. Between the ribs 100 in member 101 and extending through the member 101 is a plurality of rectangularly-shaped apertures 102. Each of the apertures 102 is provided to be placed in registration with one of the nozzles 94 when the masking member 101 is fitted on the member 90. The size of each of the apertures corresponds to the size of the die-attach pad 20 and the area designated 41 in FIGS. 3A, 3B and 3C. On opposite ends of the member 101 there is a plurality of guide members 103. Members 103 are provided for aligning the strip 1 laterally with respect to the apertures 102.

The material used to make the member 101 is such as to be able to form a fluid-tight seal with the strip 1 around the die-attach pad so as to restrict the fluid from the nozzle 95 to the die-attach pad area.

In FIG. 17, there is shown a back-up member 105 with n an air input nozzle 106. Member 105 is provided with an inflatable bladder (not shown). Along opposite sides of member 105 is a plurality of pins 107. Corresponding pins 108 are provided on the sides of the head member 90. Rubber bands or the like (not shown) are employed for coupling to the pins 107 and 108 for securing the member 105 securely to the head member 90 with the masking member 101 fitted between the two. As described with respect to the member 80 of FIG. 9, member 105 is provided for providing, when its bladder is inflated, a fluid-tight seal on the upper surface of the strip 1. The fluid-tight seal is provided for preventing loss of plating fluid through the lead frame as well as to immobilize the strip 1 during plating of the die-attach pad area.

In use, station 51 is operated in substantially the same fashion as station 50 with respect to the positioning and aligning of the strip 1 in the station, the inflation of the baldder of the back-up member 105, the coupling of the wires 97 to a source of potential and the discharge of fluid through outlets 98.

Referring to FIGS. 18–22, there is provided in station 52, a plating head member 110. In the top of member 110 there is provided a plurality of pairs of associated input and output chambers 111 and 120. Each of the chambers 111 and 120 is separated by an intermediate fluid-tight wall-like member 121. In each of the chambers 111 there is provided a pair of fluid passageways 112 and 113. Passageways 112 and 113 are provided in fluid communication with a fluid manifold (not shown) in the base of member 110 below the chambers 111. Fluid is provided to the manifold under pressure by the pump 55 which is coupled to the fluid manifold input port 114. In fluid communication with each of the chambers 120 and extending through the side of the member 110 is a fluid discharge outlet 115. Outlet 115 is provided for freely discharging fluid from the chambers 111 and 120 into the container 54.

In the center of each of the wall members 121 and extending upwardly therefrom is a rectangularly-shaped pedestal 122 for supporting a masking member 123, such as a pad of silicone rubber. Masking member 123 has a size at least equal to the area of the die-attach pad 20 of the strip 1 for masking the die-attach pad area.

On opposite sides of the wall member 121 and extending across the mouth or top of chambers 111 and 120 there is provided a pair of wires 125 and 126. Wires 125 and 126 extend substantially for the full length of the head member 110 and are provided for coupling to the positive pole of a d.c. potential source having its negative pole coupled to the sliding contact 53.

Referring to FIG. 21, there is provided a masking member 130. In the center of member 130, there is provided a plurality of rectangularly-shaped apertures 131. The edges of the apertures 131 correspond to the exterior edges of the areas 40 in FIGS. 3A, 3B and 3C. Extending from the underside of member 130 on opposite sides of apertures 131 is a pair of parallel rib members 132. Rib members 132 are provided for fitting in a corresponding pair of slots 133 in the upper surface of member 110. At opposite ends of the member 130, is a plurality of guide members 134. Members 134, like members 85 and 103, are provided for guiding the strip 1 and aligning it laterally with respect to the apertures 131.

Referring to FIG. 22, there is provided a back-up member 140. Member 140 is identical to members 80 and 105 of FIGS. 10 and 17, respectively.

In the sides of member 140 and head member 110, for example, there is provided a plurality of pins 141 and 142. Pins 141 and 142 secure, as by rubber bands and the like (not shown), the member 140 to the head member 110. Also, member 140 is fitted with an inflatable bladder (not shown) which is operable for sealing the upper surface of the strip 1 as previously described with respect to members 80 and 105.

In use, after the strip 1 is positioned in the station 52, as described with respect to stations 50 and 51, with the masking member 123 securely masking the die-attach pad 20, plating fluid will flow over the surrounding lead tips. The path of fluid flow is from the fluid passageways 112 and 113 into the chamber 111. Once the chamber 111 is filled, the fluid flows over the top of the wall 121, against the strip 1, down into the chamber 120 from which it is discharged into the container 56 through the outlet 115. With the wires 125 and 126 coupled as by a switch (not shown) to the positive pole of a d.c. potential source coupled to the cathode electrode 53, a metal in the fluid will plate out on the strip in the area surrounding the pad 20.

A preferred embodiment of the invention has been described. It is intended, however, that various changes may be made with respect thereto without departing from the spirit and scope of the invention. For example, various types of lead frames, as well as other types of metallic strips, may be plated, which might require changes in the relative positions of the apertures in the several masking members and/or a change in the central masking pedestal and member 122 and 123 of the station 52. Also, the number of plating jets in the stations may be increased or decreased to accommodate a particular application. Further, it is intended that various types and combinations of metals other than those described may be plated with the apparatus and according to the method of the present invention. Accordingly, the scope of the invention is intended not to be limited to the embodiment described, but to be construed as broadly as the following claims permit.

What is claimed is:

1. A method of selectively plating a lead frame strip, said strip including a plurality of lead frames, each of said frames having a plurality of leads, each of said leads having a tip, and a die-attach pad comprising the steps of:

plating each of said lead frames with a first gold strike plating, said first plating being directly on and restricted to the surface area of a predetermined portion of said tip of each of said leads and said die-attach pad;

plating each of said lead frames with a second plating, said second plating being a gold finish plating directly on said first plating and restricted to the area of said die-attach pad; and plating each of said lead frames with a third plating, said third plating being a silver finish plating directly on said first plating and restricted to the area of said tip portion of each of said leads.

* * * * *